(12) United States Patent
Hiraku

(10) Patent No.: US 11,515,880 B2
(45) Date of Patent: Nov. 29, 2022

(54) SEMICONDUCTOR DEVICE

(71) Applicant: RENESAS ELECTRONICS CORPORATION, Tokyo (JP)

(72) Inventor: Yasuyuki Hiraku, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/319,856

(22) Filed: May 13, 2021

(65) Prior Publication Data

US 2021/0367604 A1    Nov. 25, 2021

(30) Foreign Application Priority Data

May 22, 2020  (JP) .............................. JP2020-090120

(51) Int. Cl.
*H03L 7/085* (2006.01)
*H03L 7/081* (2006.01)

(52) U.S. Cl.
CPC .............. *H03L 7/085* (2013.01); *H03L 7/081* (2013.01)

(58) Field of Classification Search
CPC ................................. H03L 7/085; H03L 7/081
USPC .................................. 327/147–149, 156–158
See application file for complete search history.

(56) References Cited

U.S. PATENT DOCUMENTS

| | | | | |
|---|---|---|---|---|
| 5,675,273 A * | 10/1997 | Masleid | ............. | H03K 19/0013 |
| | | | | 327/156 |
| 6,469,550 B1 * | 10/2002 | Kurd | ........................ | H03L 7/081 |
| | | | | 327/144 |
| 6,925,135 B2 * | 8/2005 | Smith | ....................... | H03L 7/07 |
| | | | | 375/376 |
| 7,157,949 B2 * | 1/2007 | Chen | ..................... | H03L 7/0891 |
| | | | | 327/158 |
| 7,406,145 B2 | 7/2008 | Mori | | |
| 7,598,789 B2 * | 10/2009 | Chou | .................... | H04L 25/028 |
| | | | | 327/108 |
| 8,542,042 B1 * | 9/2013 | Pham | ........................ | H03L 7/23 |
| | | | | 327/158 |
| 9,413,344 B2 * | 8/2016 | Bowman | ................ | H03K 5/156 |
| 10,334,363 B2 * | 6/2019 | Ito | ............................ | H04R 3/04 |
| 10,635,159 B2 * | 4/2020 | Kolla | .................... | H02M 3/157 |
| 11,249,530 B1 * | 2/2022 | Pal | ............................ | G05F 3/24 |
| 2009/0271133 A1 * | 10/2009 | Ho | ..................... | G01R 31/3016 |
| | | | | 702/69 |
| 2014/0266349 A1 * | 9/2014 | Iyer | ........................... | H03L 7/08 |
| | | | | 327/158 |
| 2017/0344102 A1 * | 11/2017 | Kolla | .................... | G06F 1/3296 |

(Continued)

FOREIGN PATENT DOCUMENTS

| | | | |
|---|---|---|---|
| JP | 2005-269456 A | | 9/2005 |
| JP | 2012073169 A | * | 4/2012 |
| KR | 20070005874 A | * | 10/2007 |

(Continued)

*Primary Examiner* — Adam D Houston
(74) *Attorney, Agent, or Firm* — McDermott Will & Emery LLP

(57) ABSTRACT

A semiconductor device includes a clock generating circuit and a jitter measurement circuit. The clock generating circuit is input with a control value for changing a cycle of the clock thereof. The jitter measurement circuit has a first logic circuit operated with using an output clock of the clock generating circuit as an input and a first delay element, and is configured to output the presence/absence of a jitter of the clock generating circuit.

2 Claims, 16 Drawing Sheets

(56) References Cited

U.S. PATENT DOCUMENTS

2021/0367604 A1* 11/2021 Hiraku .................... H03L 7/081

FOREIGN PATENT DOCUMENTS

| WO | WO-2013006231 A2 * | 1/2013 | ........... H03K 3/0315 |
| WO | WO-2014023811 A1 * | 2/2014 | ............. G01R 29/26 |

* cited by examiner

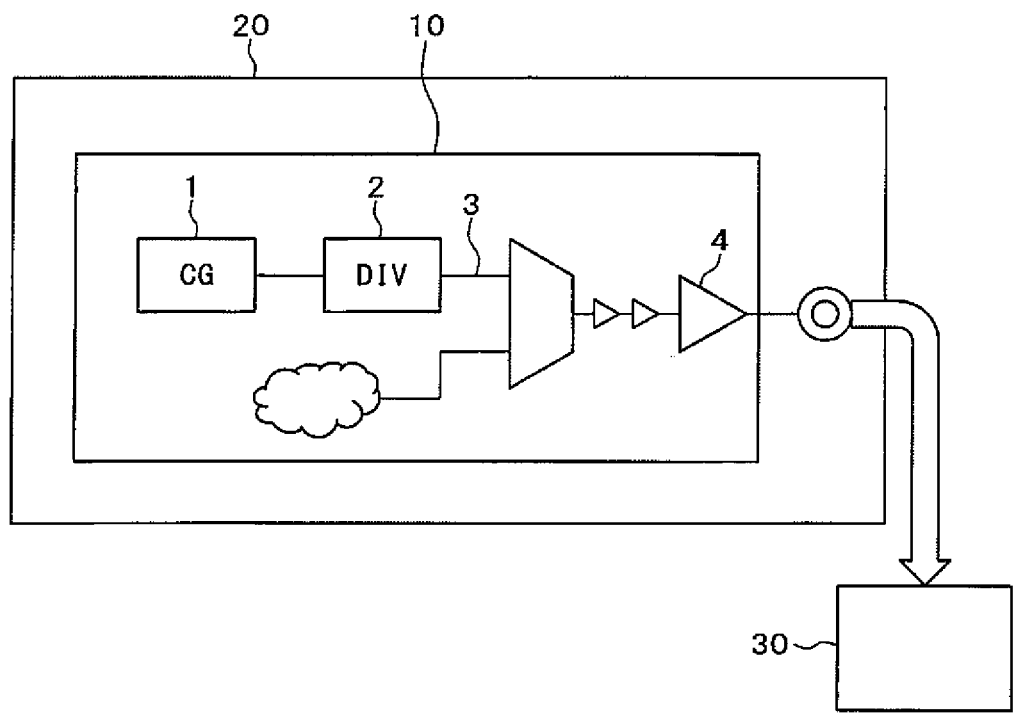
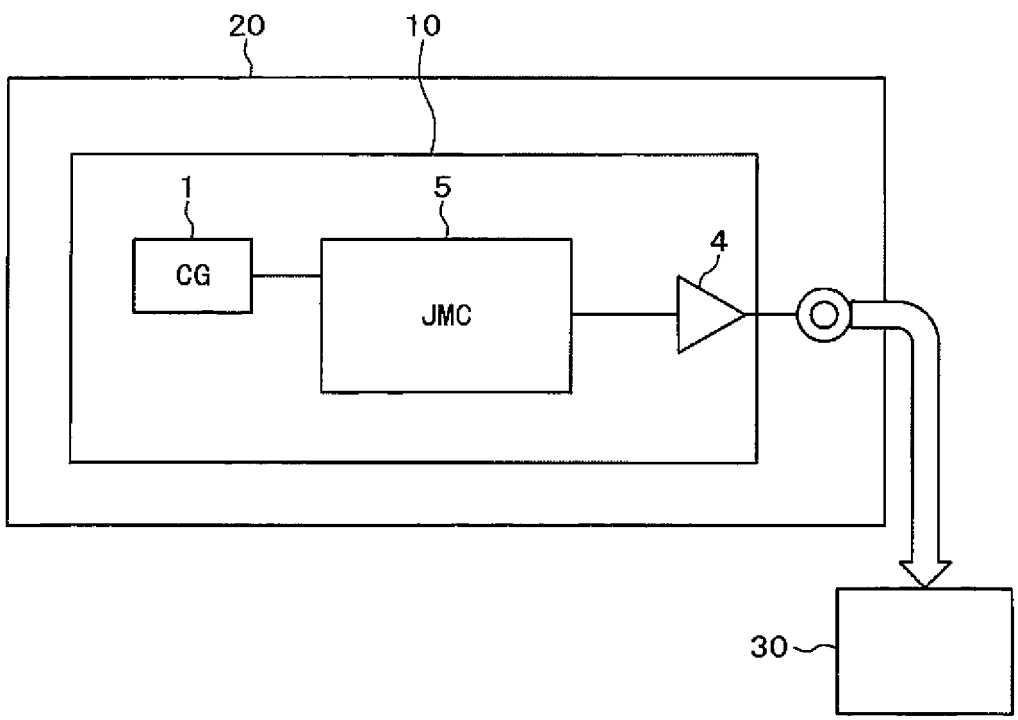

FIG. 5

| RefCLK | N | CKV Freq. | TCKV |
|---|---|---|---|
| 1.000MHz | 1000 | 1000MHz | 1000ps |
| 1.001MHz | 1000 | 1001MHz | 999ps |
| 1.002MHz | 1000 | 1002MHz | 998ps |
| 1.003MHz | 1000 | 1003MHz | 997ps |
| 1.004MHz | 1000 | 1004MHz | 996ps |
| 1.005MHz | 1000 | 1005MHz | 995ps |
| 1.006MHz | 1000 | 1006MHz | 994ps |
| 1.007MHz | 1000 | 1007MHz | 993ps |
| 1.008MHz | 1000 | 1008MHz | 992ps |
| 1.009MHz | 1000 | 1009MHz | 991ps |
| 1.010MHz | 1000 | 1010MHz | 990ps |
| 1.011MHz | 1000 | 1011MHz | 989ps |
| 1.012MHz | 1000 | 1012MHz | 988ps |
| 1.013MHz | 1000 | 1013MHz | 987ps |
| 1.014MHz | 1000 | 1014MHz | 986ps |
| 1.015MHz | 1000 | 1015MHz | 985ps |
| 1.016MHz | 1000 | 1016MHz | 984ps |
| 1.017MHz | 1000 | 1017MHz | 983ps |
| 1.018MHz | 1000 | 1018MHz | 982ps |
| 1.019MHz | 1000 | 1019MHz | 981ps |
| 1.020MHz | 1000 | 1020MHz | 980ps |

FIG. 6

| RefCLK | N | CKV Freq. | TCKV |
|---|---|---|---|
| 1.000MHz | 1000 | 1000MHz | 1000ps |
| 1.000MHz | 1001 | 1001MHz | 999ps |
| 1.000MHz | 1002 | 1002MHz | 998ps |
| 1.000MHz | 1003 | 1003MHz | 997ps |
| 1.000MHz | 1004 | 1004MHz | 996ps |
| 1.000MHz | 1005 | 1005MHz | 995ps |
| 1.000MHz | 1006 | 1006MHz | 994ps |
| 1.000MHz | 1007 | 1007MHz | 993ps |
| 1.000MHz | 1008 | 1008MHz | 992ps |
| 1.000MHz | 1009 | 1009MHz | 991ps |
| 1.000MHz | 1010 | 1010MHz | 990ps |
| 1.000MHz | 1011 | 1011MHz | 989ps |
| 1.000MHz | 1012 | 1012MHz | 988ps |
| 1.000MHz | 1013 | 1013MHz | 987ps |
| 1.000MHz | 1014 | 1014MHz | 986ps |
| 1.000MHz | 1015 | 1015MHz | 985ps |
| 1.000MHz | 1016 | 1016MHz | 984ps |
| 1.000MHz | 1017 | 1017MHz | 983ps |
| 1.000MHz | 1018 | 1018MHz | 982ps |
| 1.000MHz | 1019 | 1019MHz | 981ps |
| 1.000MHz | 1020 | 1020MHz | 980ps |

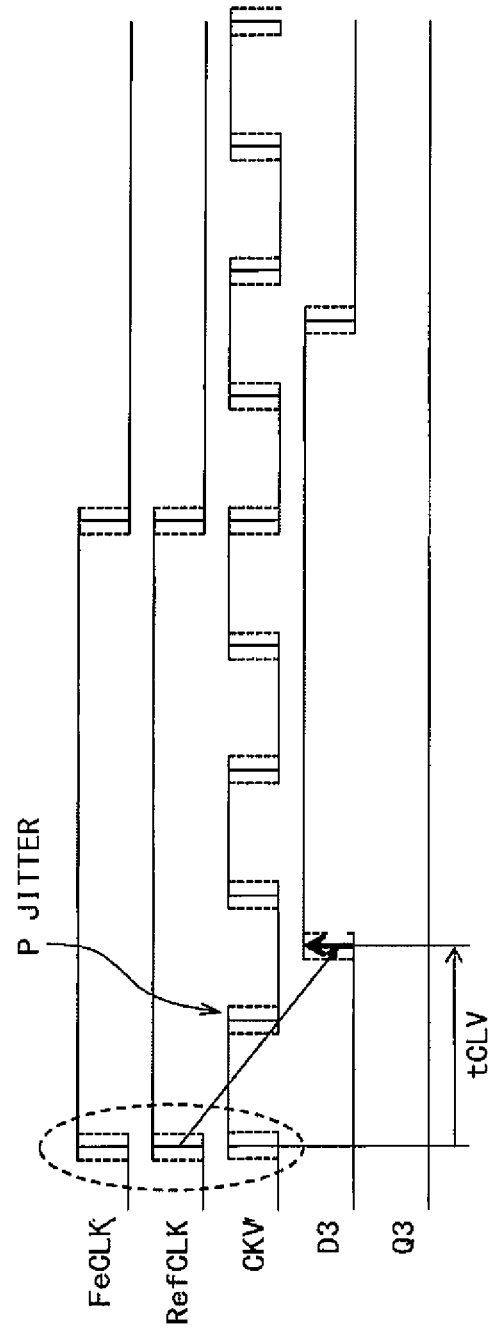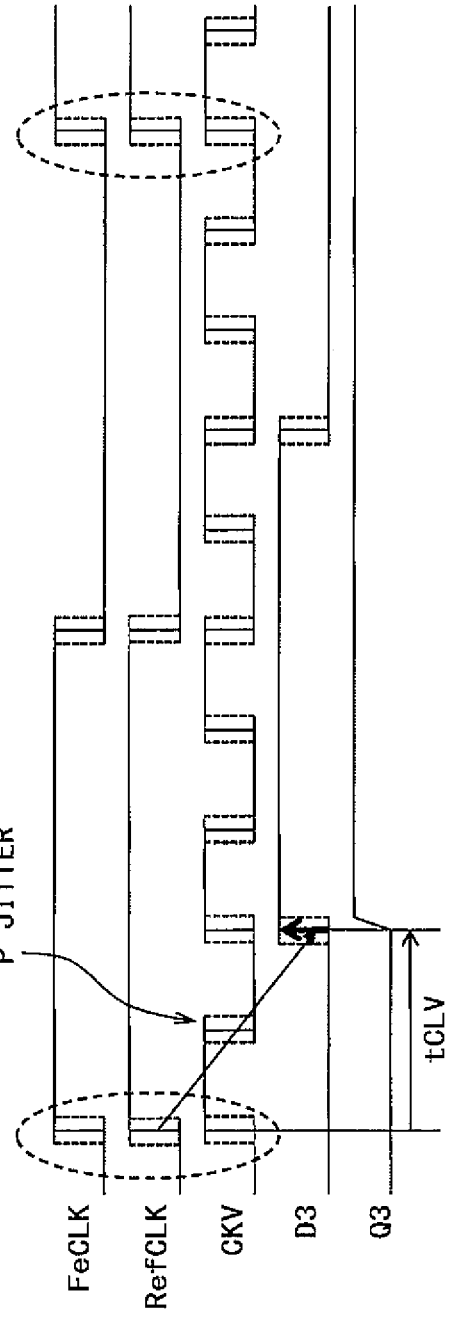

SEMICONDUCTOR DEVICE

CROSS-REFERENCE TO RELATED APPLICATIONS

The disclosure of Japanese Patent Application No. 2020-090120 filed on May 22, 2020 including the specification, drawings and abstract is incorporated herein by reference in its entirety.

BACKGROUND

This disclosure relates to a semiconductor device and is applicable to, for example, a semiconductor device including a clock generating circuit.

A clock generating circuit such as a PLL (Phase Locked Loop) circuit is incorporated in various devices and systems. Normally, the clock generated by the clock generating circuit includes a jitter component. If this jitter component becomes larger than the allowable value, it will interfere with the normal operation in the device or system in which the clock generating circuit is incorporated.

There are disclosed techniques listed below.
[Patent Document 1] Japanese Unexamined Patent Application Publication No. 2005-269456

SUMMARY

When the clock signal generated by the clock generating circuit is high speed, it is not possible in some cases to measure the actual value of the jitter of the clock generating circuit.

According to one aspect of this disclosure, a semiconductor device includes a clock generating circuit and a jitter measurement circuit. The clock generating circuit is input with a control value for changing a cycle of the clock thereof. The jitter measurement circuit has a first logic circuit operated with using an output clock of the clock generating circuit as an input and a first delay element, and is configured to output the presence/absence of a jitter of a clock source.

According to the semiconductor device described above, it is possible to measure the magnitude of the jitter of the clock generating circuit.

BRIEF DESCRIPTION OF THE DRAWINGS

FIG. 1 is a diagram for describing a jitter measurement of a clock generating circuit according to a comparative example.

FIG. 2 is a diagram for describing a jitter measurement of a clock generating circuit according to the embodiment.

FIG. 5 is a diagram for describing an example of changing a cycle of an output clock by changing a frequency of a reference clock.

FIG. 6 is a diagram for describing an example of changing a cycle of an output clock by changing a multiplication set value.

FIG. 13A is a timing diagram showing an operation in the case where the output clock cycle in the jitter measurement circuit shown in FIG. 12 is long.

FIG. 13B is a timing diagram showing an operation in the case where the output clock cycle in the jitter measurement circuit shown in FIG. 12 is short.

DETAILED DESCRIPTION

Figure 3:
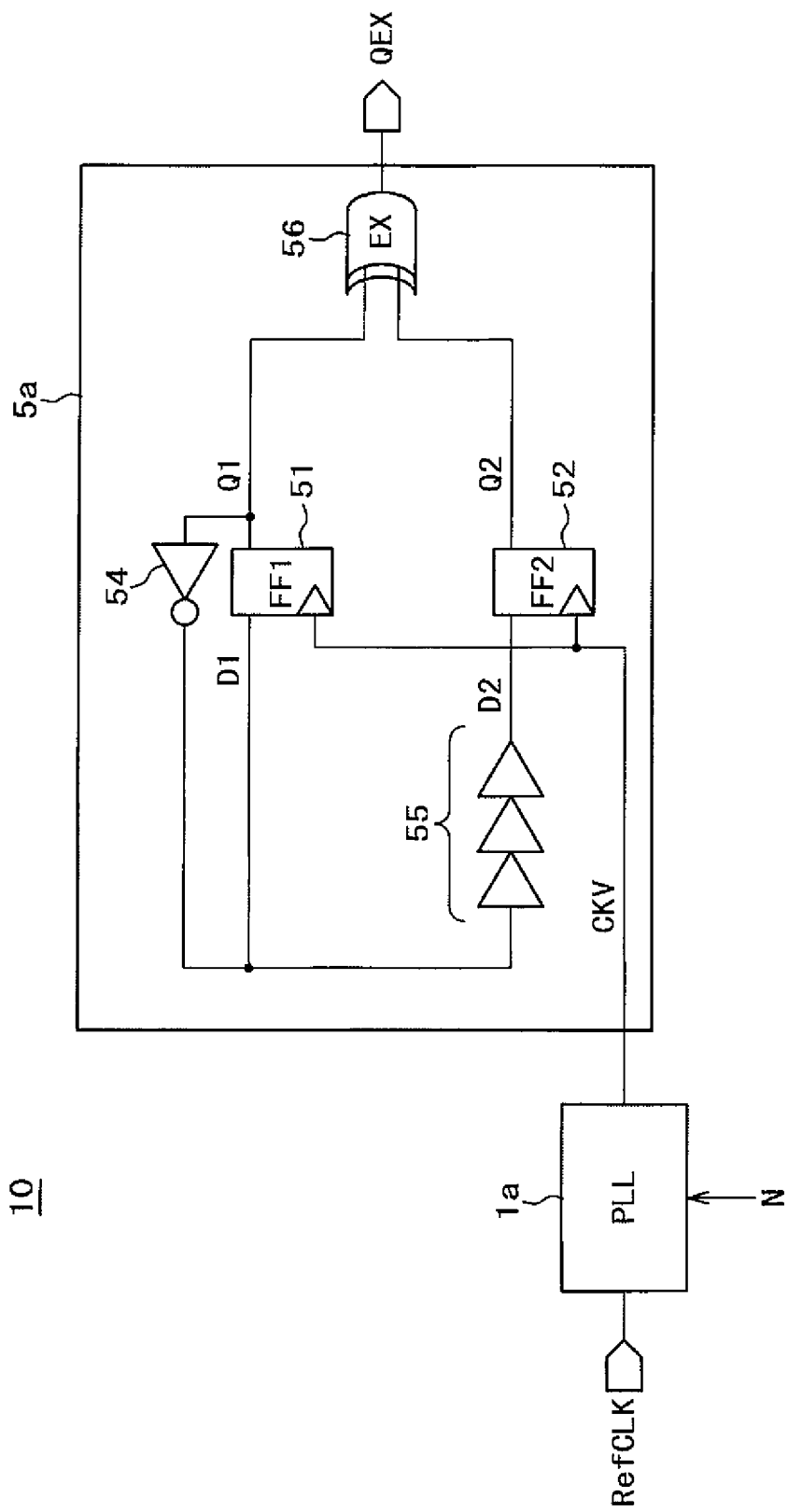
FIG. 3 is a block diagram showing a configuration of a jitter measurement circuit of a PLL circuit according to the first example.

Hereinafter, embodiments and examples will be described with reference to the drawings. However, the same components are denoted by the same reference characters and the repetitive description thereof will be omitted in the following description. Note that the drawings will be represented schematically in terms of width, thickness, shape, and others as compared to actual aspects in order to make the description clearer, but the drawings are mere examples and do not limit the interpretation of the present disclosure.

First, the technology (comparative example) examined by the present discloser will be described with reference to FIG. 1. FIG. 1 is a diagram for describing a jitter measurement of a clock generating circuit according to a comparative example.

The high-speed clock signal generated by a clock generating circuit (CG) 1 is too fast to drive an output buffer 4 provided in a semiconductor device 10. Therefore, as shown in FIG. 1, the output of the clock generating circuit 1 divided by a frequency dividing circuit 2 is output to the outside of the semiconductor device 10 via the output buffer 4, and the jitter is measured by a measuring device 30. Here, the frequency of the clock generated by the clock generating circuit 1 is, for example, 1 GHz or higher. Also, the frequency of the clock divided by the frequency dividing circuit 2 is, for example, about 100 MHz. Therefore, the actual value of the jitter (period jitter) of the clock generating circuit cannot be measured. In addition, because of being subjected to the power supply noise and inter-signal interference in the frequency dividing circuit 2, a clock signal wiring 3, or the output buffer 4 in the subsequent stage of the clock generating circuit 1 and being affected by the power supply noise and reflection in a system of an evaluation board 20, the jitter actual value cannot be measured.

Next, the embodiment will be described with reference to FIG. 2. FIG. 2 is a diagram for describing the jitter measurement of the clock generating circuit according to the embodiment.

In this embodiment, a jitter measurement circuit (JMC) 5 is provided between the clock generating circuit 1 and the output buffer 4. The jitter measurement circuit 5 is composed of a logic circuit, and the clock generated by the clock generating circuit 1 is given thereto without being divided. The jitter measurement circuit 5 converts the time axis analog information, which is the jitter of the clock, into a digital value of 0/1 and outputs the converted value. Here, the clock generating circuit 1 which is the target of the jitter measurement is composed of, for example, a PLL circuit, a DLL (Delay Locked Loop) circuit that synchronizes the phase of the delay clock and the phase of the reference clock, or a VCXO (Voltage Controlled Crystal Oscillator).

Accordingly, even when the frequency is 1 GHz or higher, the actual value of the jitter (for example, period jitter) of the clock generating circuit 1 can be measured. In addition, the actual value of jitter can be measured without being affected by the power supply noise, inter-signal interference, and reflection in the output buffer 4 or the evaluation board 20. As a result, abnormal samples due to the clock jitter can be sorted out in the product test.

First Example

Figure 4:
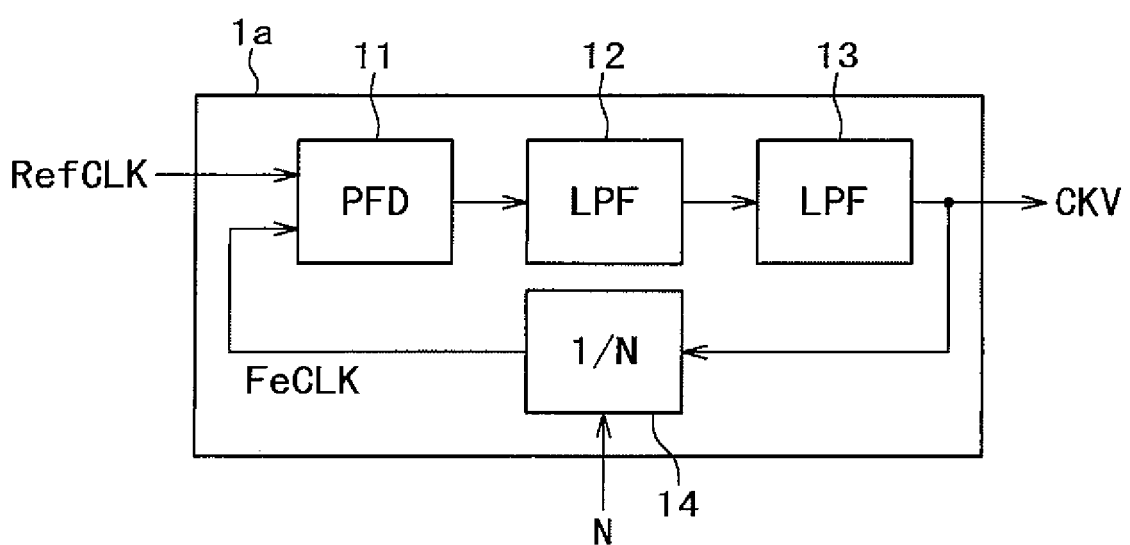
FIG. 4 is a block diagram showing a configuration of the PLL circuit shown in FIG. 3.

The configuration of the jitter measurement circuit of the semiconductor device according to the first example will be described with reference to FIG. 3 and FIG. 4. FIG. 3 is a block diagram showing the configuration of the jitter measurement circuit according to the first example. FIG. 4 is a block diagram showing the configuration of the PLL circuit shown in FIG. 3.

The semiconductor device 10 according to the first example has the configuration in which the clock generating circuit 1 of the semiconductor device 10 according to the embodiment is composed of a PLL circuit 1a, and is formed in a semiconductor chip. A jitter measurement circuit 5a in the first example detects the jitter included in the output clock (CKV) output from the PLL circuit 1a. As shown in FIG. 4, the PLL circuit 1 is composed of a phase comparator (PFD) 11, a low-pass filter (LPF) 12, a voltage controlled oscillator (VCO) 13, and a 1/N frequency divider circuit 14.

In the first example, since the frequency of the output clock (CKV) of the PLL circuit 1a needs to be changed for observation, the PLL circuit 1a is provided with the 1/N frequency divider circuit 14 as a programmable frequency divider circuit. The control of the clock frequency is executed by giving the multiplication set value (N) as a set signal from outside of the PLL circuit 1a. Alternatively, the frequency of the output clock (CKV) may be changed by changing the frequency of the reference clock (RefCLK) while fixing the multiplication set value (N).

As shown in FIG. 3, the jitter measurement circuit 5a includes a first flip-flop (FF1) 51, a second flip-flop (FF2) 52, an inverter 54, a delay element 55, and an exclusive OR circuit 56. Here, the first flip-flop (FF1) 51, the second flip-flop (FF2) 52, the inverter 54, and the exclusive OR circuit 56 are logic circuits. The path of Q1 to D1 composed of the first flip-flop 51 and the inverter 54 is a toggle flip-flop for generating reference data. Here, Q1 is the data at the output terminal of the first flip-flop 51, and D1 is the data at the input terminal of the first flip-flop 51. Every time when the output clock (CKV) rises, the value of Q1 changes alternately with "0" and "1" like "0101", and this becomes a reference data signal. The path of D1 to D2 has a delay element 55 with a fixed delay, and this makes the setup timing of the second flip-flop 52 stricter than that of the first flip-flop 51. Here, Q2 is the data at the output terminal of the second flip-flop 52, and D2 is the data at the input terminal of the second flip-flop 52.

Figure 7:
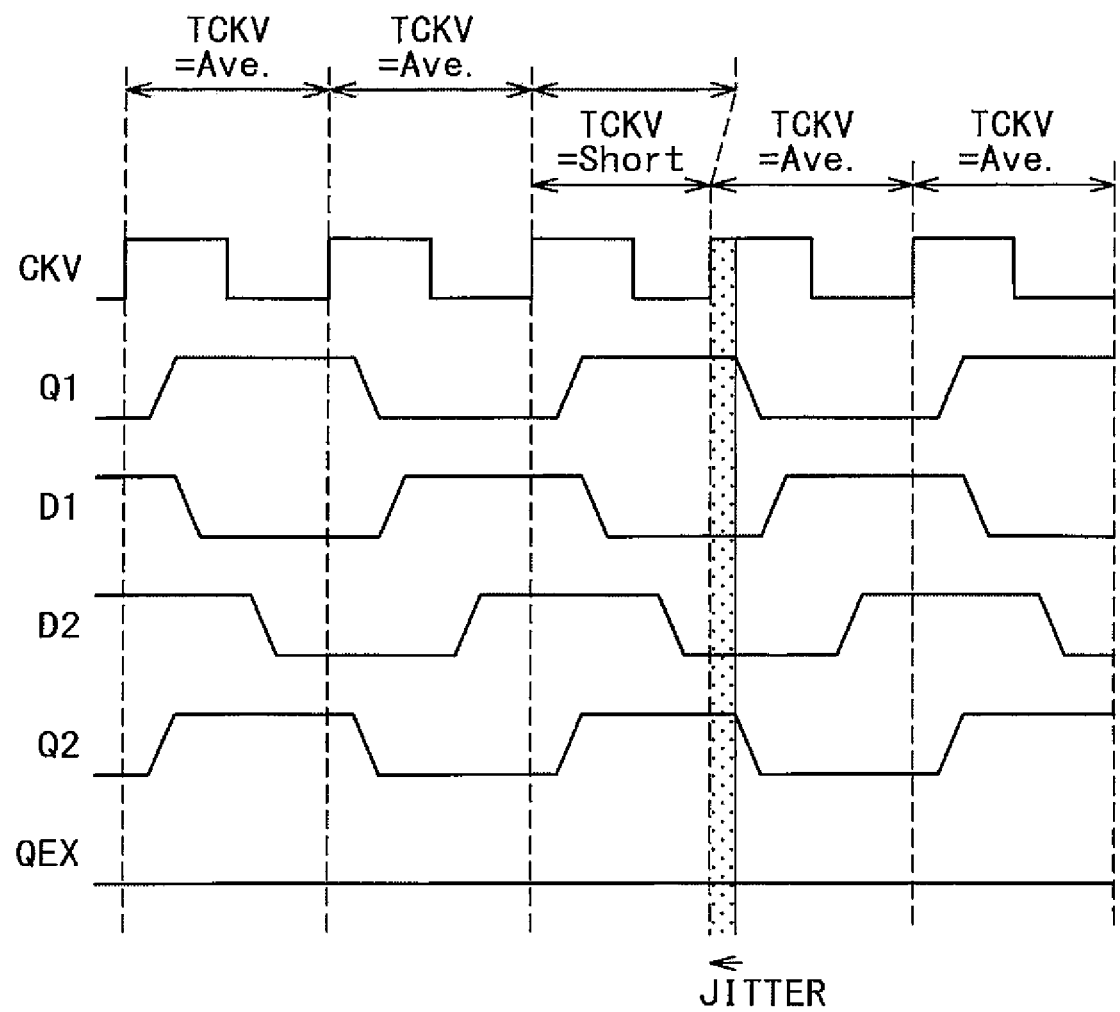
FIG. 7 is a timing diagram showing an operation in the case where an output clock cycle in the jitter measurement circuit shown in FIG. 3 is long.
Figure 8:
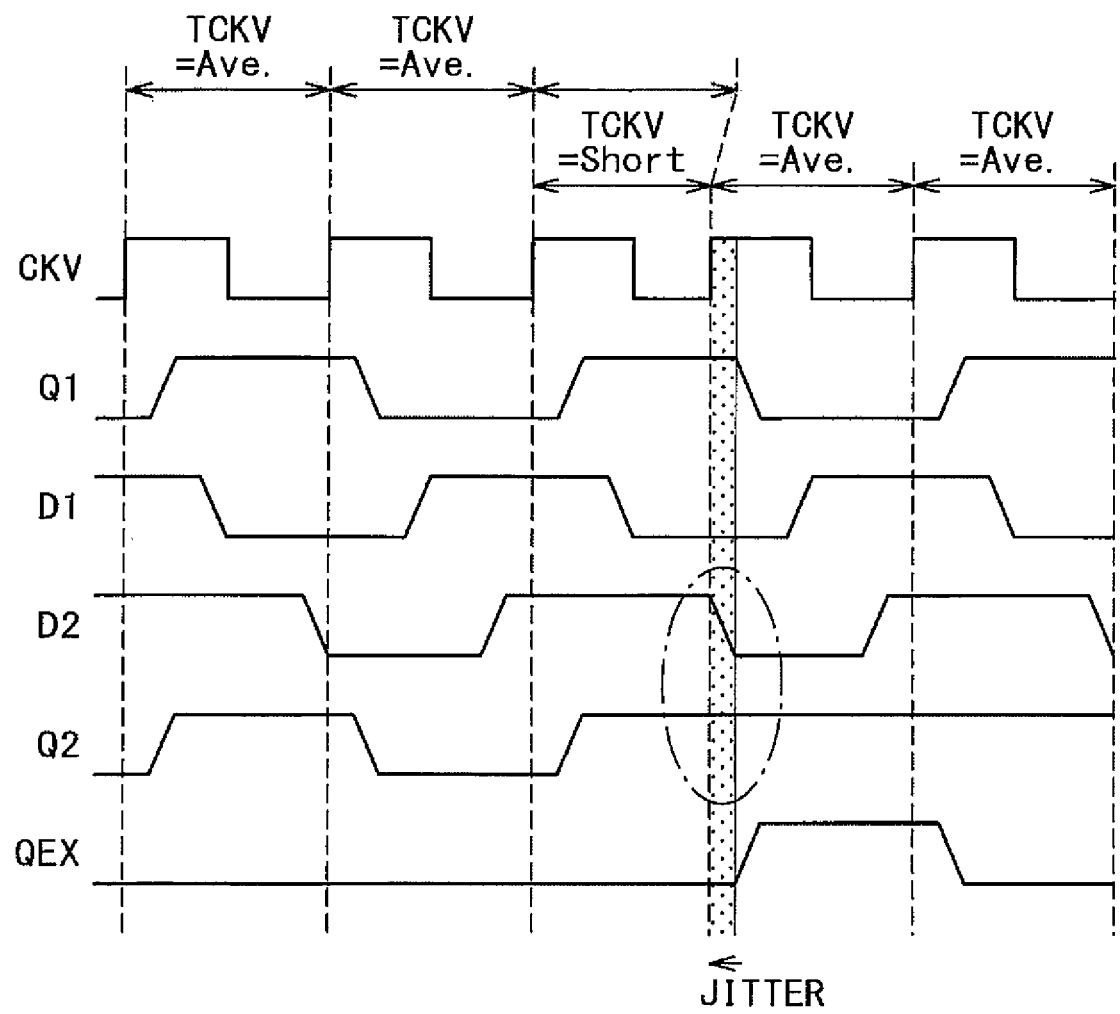
FIG. 8 is a timing diagram showing an operation in the case where an output clock cycle in the jitter measurement circuit shown in FIG. 3 is short.
Figure 9:
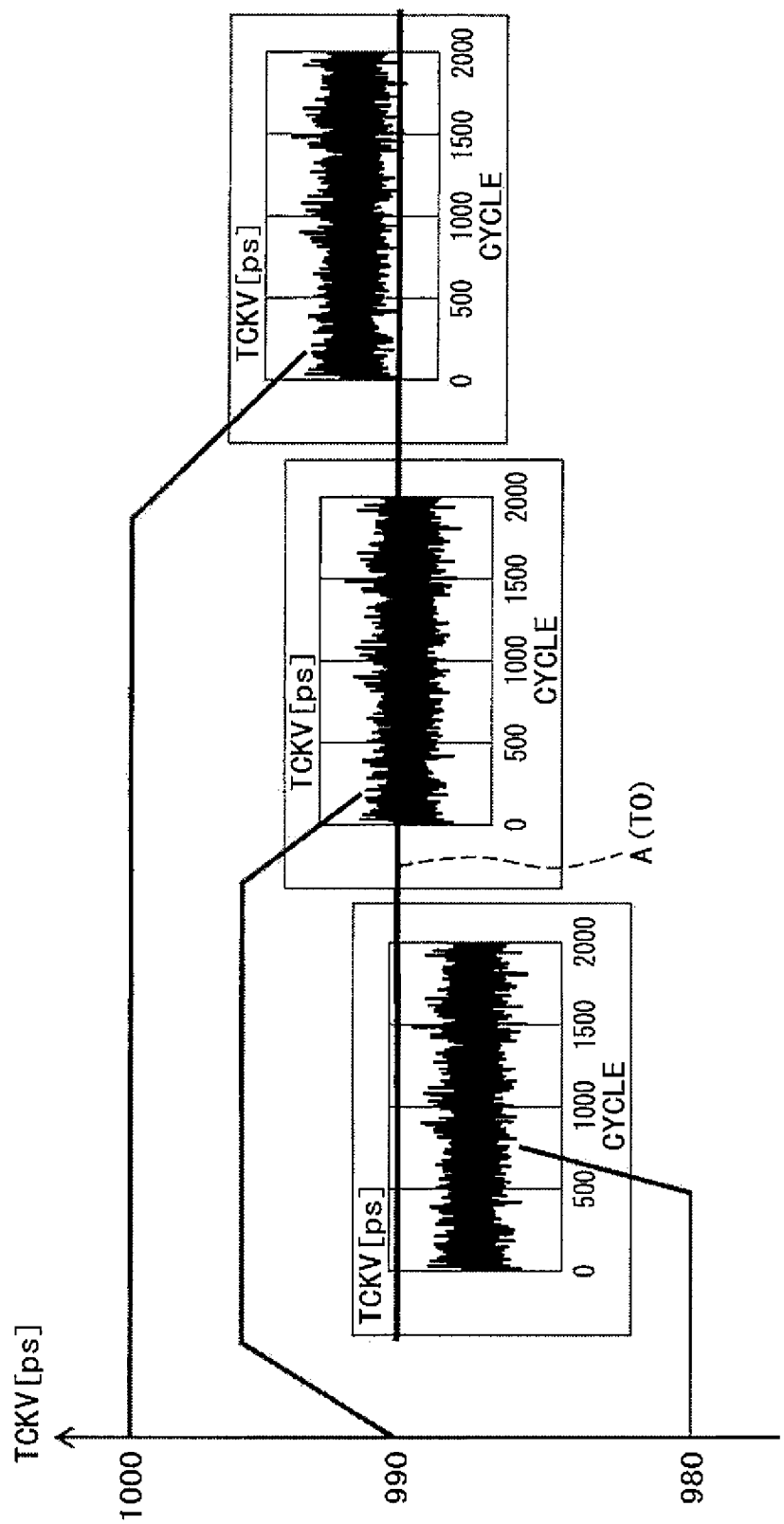
FIG. 9 is a diagram showing a fluctuation distribution of the cycle of the output clock.
Figure 10:
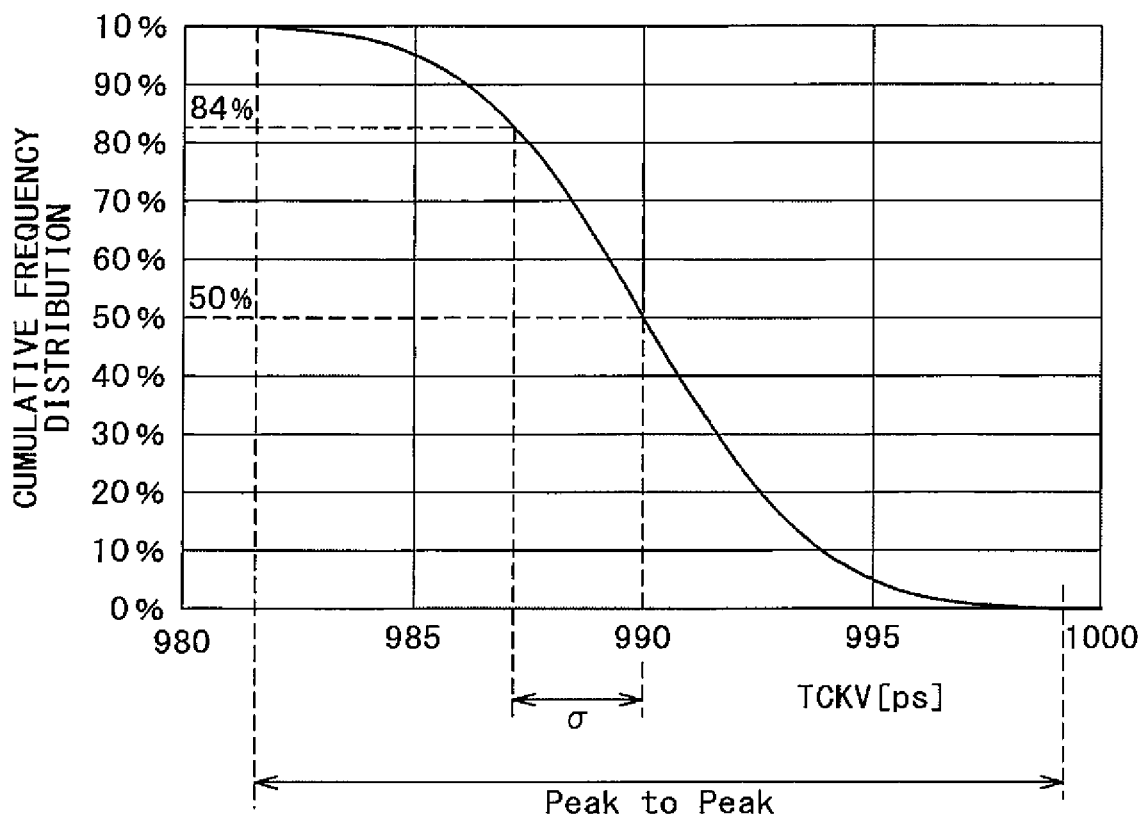
FIG. 10 is a diagram showing a cumulative frequency distribution of outputs of a jitter output circuit.
Figure 11:
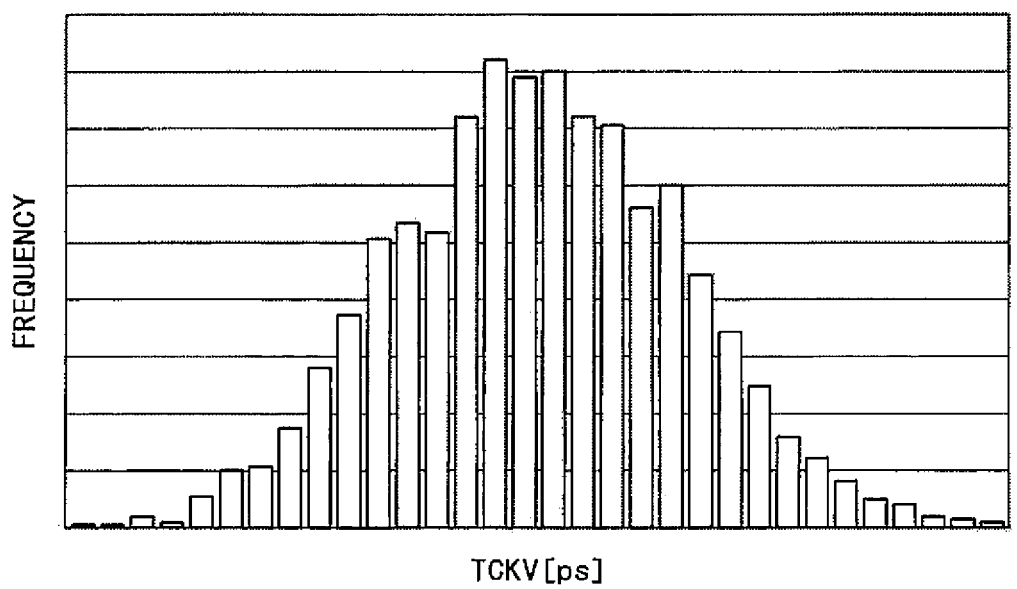
FIG. 11 is a diagram showing a histogram of the jitter of the output clock calculated from the cumulative frequency distribution of FIG. 10.

The operation of the jitter measurement circuit according to the first example will be described with reference to FIG. 5 to FIG. 11. FIG. 5 is a diagram for describing an example of changing a cycle of an output clock by changing a frequency of a reference clock. FIG. 6 is a diagram for describing an example of changing a cycle of an output clock by changing a multiplication set value. FIG. 7 is a timing diagram showing an operation in the case where an output clock cycle in the jitter measurement circuit shown in FIG. 3 is long. FIG. 8 is a timing diagram showing an operation in the case where an output clock cycle in the jitter measurement circuit shown in FIG. 3 is short. FIG. 9 is a diagram showing a fluctuation distribution of the cycle of the output clock. FIG. 10 is a diagram showing a cumulative frequency distribution of outputs of the jitter output circuit. FIG. 11 is a diagram showing a histogram of the jitter of the output clock calculated from the cumulative frequency distribution of FIG. 10.

In the jitter measurement, as shown in FIG. 5, the cycle (TCKV) of the output clock (CKV) is sequentially changed by changing the frequency of the reference clock (RefCLK). Alternatively, as shown in FIG. 6, the cycle (TCKV) of the output clock (CKV) is sequentially changed by changing the multiplication set value (N) while fixing the frequency of the reference clock (RefCLK).

When the cycle (TCKV) of the output clock (CKV) is long, as shown in FIG. 7, the timing margin on the side of the second flip-flop 52 can also be secured. Even at the moment when the cycle (TCKV) becomes shorter than the average due to the jitter of the output clock (CKV), there is no problem in the setup of the D2, and the output (QEX) of the exclusive OR circuit 56 is constantly "0".

On the other hand, when the cycle (TCKV) of the output clock (CKV) is short, as shown in FIG. 8, the timing margin of the second flip-flop 52 seems to be insufficient. At the moment when the cycle (TCKV) becomes shorter than the average due to the jitter of the output clock (CKV), the setup violation of the D2 occurs. As shown in the region surrounded by an ellipse of one-dot broken line in FIG. 8, Q2 does not change from "1" to "0", and the output (QEX) of the exclusive OR circuit 56 becomes "1" only during that period.

As shown in FIG. 9, the cycle (TCKV) of the actual output clock (CKV) is randomly fluctuated and distributed for each cycle about the average cycle. Further, the cycle (T0) in which the setup margin of the second flip-flop 52 is 0 [ps] is determined by the delay element 55 between D1 and D2, and is therefore fixed during the measurement.

Therefore, when the cycle (TCKV) of the output clock (CKV) is long in the jitter measurement, the probability that the setup violation occurs is low. Also, when the cycle (TCKV) of the output clock (CKV) is short, the probability that the setup violation occurs becomes high. Here, the probability that the setup violation occurs is the probability that the cycle (TCKV) is below the solid line A in FIG. 9.

For example, when the cycle (TCKV) is long such as 1000 [ps], the setup violation is 0% because all of the cycle (TCKV) is above the solid line A. Also, when the cycle (TCKV) is intermediate such as 990 [ps], the setup violation is 50% because about half of the cycle (TCKV) is above the solid line A. Further, when the cycle (TCKV) is short such as 980 [ps], the setup violation is 100% because all of the cycle (TCKV) is below the solid line A.

Since the cycle (TCKV) is swept in the jitter measurement, the probability that the setup violation of the second flip-flop 52 for 1000 times occurs in each cycle (TCKV) is the same as the probability that the output (QEX) of the exclusive OR circuit 56 becomes "1". This is plotted on a graph to obtain the cumulative frequency distribution of jitter shown in FIG. 10. Further, the graph obtained by differentiating it corresponds to the histogram of jitter shown in FIG. 11.

According to the first example, by using the VCO frequency (cycle) as a ruler for measuring time, calibration becomes unnecessary. As a result, the circuit scale is reduced and the operation is simplified. In addition, this makes it possible to measure the period jitter with high accuracy. Note that the VCO frequency is controlled by changing the multiplication set value (N) or changing the frequency of the reference clock (RefCLK) of the input of the PLL circuit.

In the first example, the PLL circuit has been described as an example of the clock generating circuit, but it is also possible to use a DLL circuit, a VCXO, or the like that can variably control the frequency.

Second Example

Figure 12:
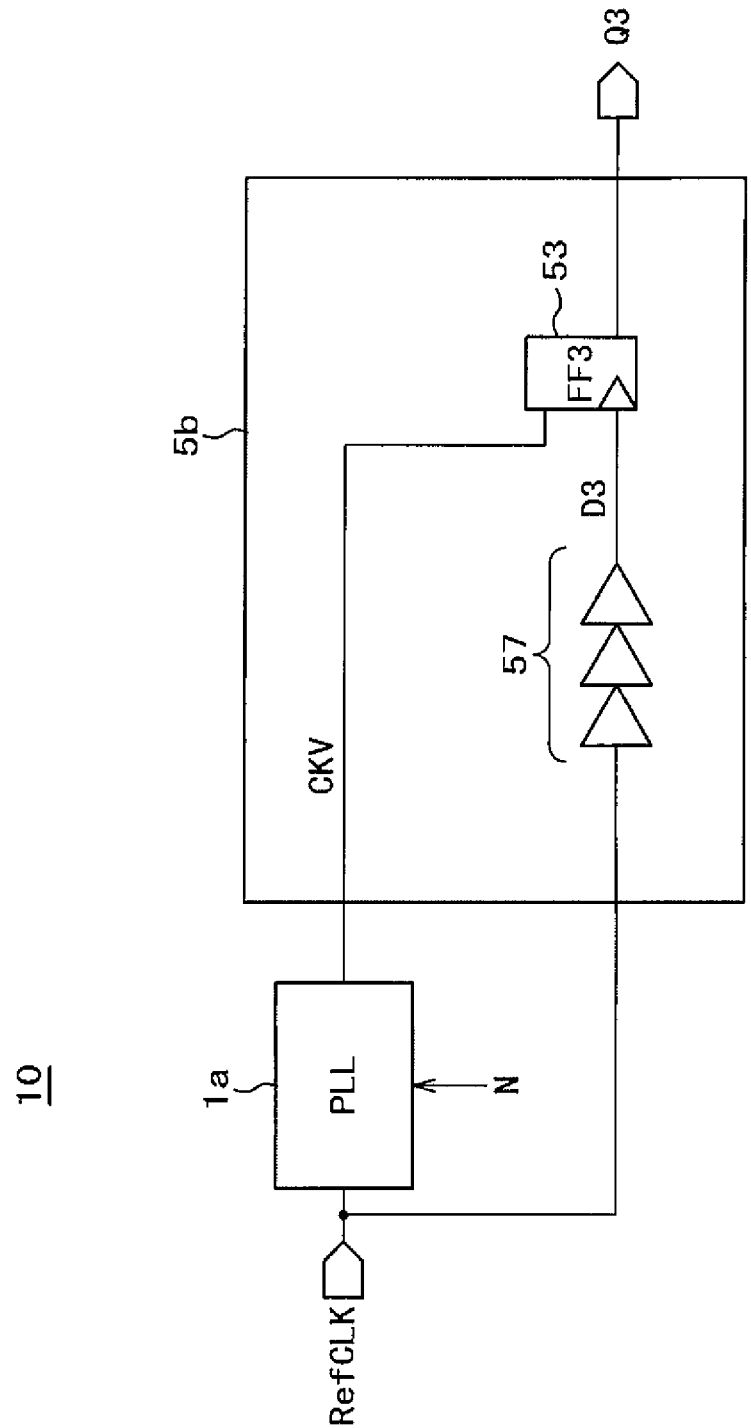
FIG. 12 is a block diagram showing a configuration of a jitter measurement circuit according to the second example.

The configuration of the jitter measurement circuit of the semiconductor device according to the second example will be described with reference to FIG. 12. FIG. 12 is a block diagram showing the configuration of the jitter measurement circuit according to the second example.

In the semiconductor device 10 according to the second example, a jitter measurement circuit 5b is formed in the semiconductor chip instead of the jitter measurement circuit 5a of the semiconductor device 10 according to the first example. The jitter measurement circuit 5b in the second example measures a phase jitter which is the jitter between the reference clock (RefCLK) as the input clock of the PLL circuit 1a and the output clock (CKV). The jitter measurement circuit 5a in the first example measures a period jitter of the output clock (CKV) of the PLL circuit 1a. The second example is different from the first example in the type of the jitter to be measured.

As shown in FIG. 12, the jitter measurement circuit 5b includes a third flip-flop (FF3) 53 and a delay element 57. Here, the third flip-flop 53 is a logic circuit. The delay element 57 is a fixed delay and has a delay amount corresponding to one cycle of the output clock (CKV). A clock (D3) obtained by delaying the reference clock (RefCLK) is input to a clock terminal of the third flip-flop 53, and the output clock (CKV) is input to a data terminal of the third flip-flop 53. Note that the clock frequency of the PLL circuit 1a is controlled in the same manner as in the first example.

The operation of the jitter measurement circuit according to the second example will be described with reference to FIG. 13A and FIG. 13B. FIG. 13A is a timing diagram showing the operation in the case where the output clock cycle in the jitter measurement circuit shown in FIG. 12 is long. FIG. 13B is a timing diagram showing the operation in the case where the output clock cycle in the jitter measurement circuit shown in FIG. 12 is short.

Since the PLL circuit 1a outputs the output clock (CKV) that is synchronized in phase with the reference clock (RefCLK), it is synchronized with the reference clock (RefCLK) at the time of the N multiplication. Therefore, the nearest 0-th, N-th, 2N-th, and 3N-th phase differences are stably constant. Accordingly, even if the cycle (TCKV) of the output clock (CKV) of the PLL circuit 1a is changed and the output result of the third flip-flop 53 is plotted by RefCLK-CKV according to the same theory as in the first example, the result is constant. Therefore, the cumulative frequency distribution and the histogram of the jitter cannot be obtained.

FIG. 13A and FIG. 13B show the timing diagrams in the case of TCKV=TRefCLK/5. Here, the TRefCLK is the cycle of the reference clock (RefCLK). The delay amount of the fixed delay of the delay element 57 is defined as TCLV. In the region surrounded by an ellipse of broken line in each of FIG. 13A and FIG. 13B, the edges of the reference clock (RefCLK), the output clock (CKV), and the 1/N frequency divider circuit 14 are synchronized with each other. The broken lines on both sides of each edge represent the range of the phase jitter (P_JITTER).

The third flip-flop 53 takes in the output clock (CKV) at the rising edge of the clock (D3). The clock (D3) rises with a delay of TCLV from the rise of the reference clock (RefCLK). In FIG. 13A, the low level of the output clock (CKV) is taken in at the rising edge of the clock (D3) in the range in which the phase jitter of the output clock (CKV) and the clock (D3) does not occur. In FIG. 13B, the low level of the output clock (CKV) is taken in at the rising edge of the clock (D3) in the range in which the phase jitter of the output clock (CKV) and the clock (D3) occurs.

As shown in FIG. 13A and FIG. 13B, the cycle (TCKV) of the output clock (CKV) is changed and the output (Q3) of the third flip-flop 53 is plotted by D3-CKV. Consequently, the timing margin is changed as in the first example, and the cumulative frequency distribution of the jitter between two clocks and the histogram of the jitter can be obtained.

According to the second example, by using the VCO frequency (cycle) as a ruler for measuring time, calibration becomes unnecessary. As a result, the circuit scale is reduced and the operation is simplified. In addition, this makes it possible to measure the phase jitter between the input clock and the output clock of the PLL circuit with high accuracy. Note that the VCO frequency is controlled by changing the multiplication set value (N) or changing the frequency of the reference clock (RefCLK) of the input of the PLL circuit.

In the second example, the PLL circuit has been described as an example of the clock generating circuit, but it is also possible to use a DLL circuit or the like that has an input clock and an output clock and can variably control the frequency.

Third Example

Figure 14:
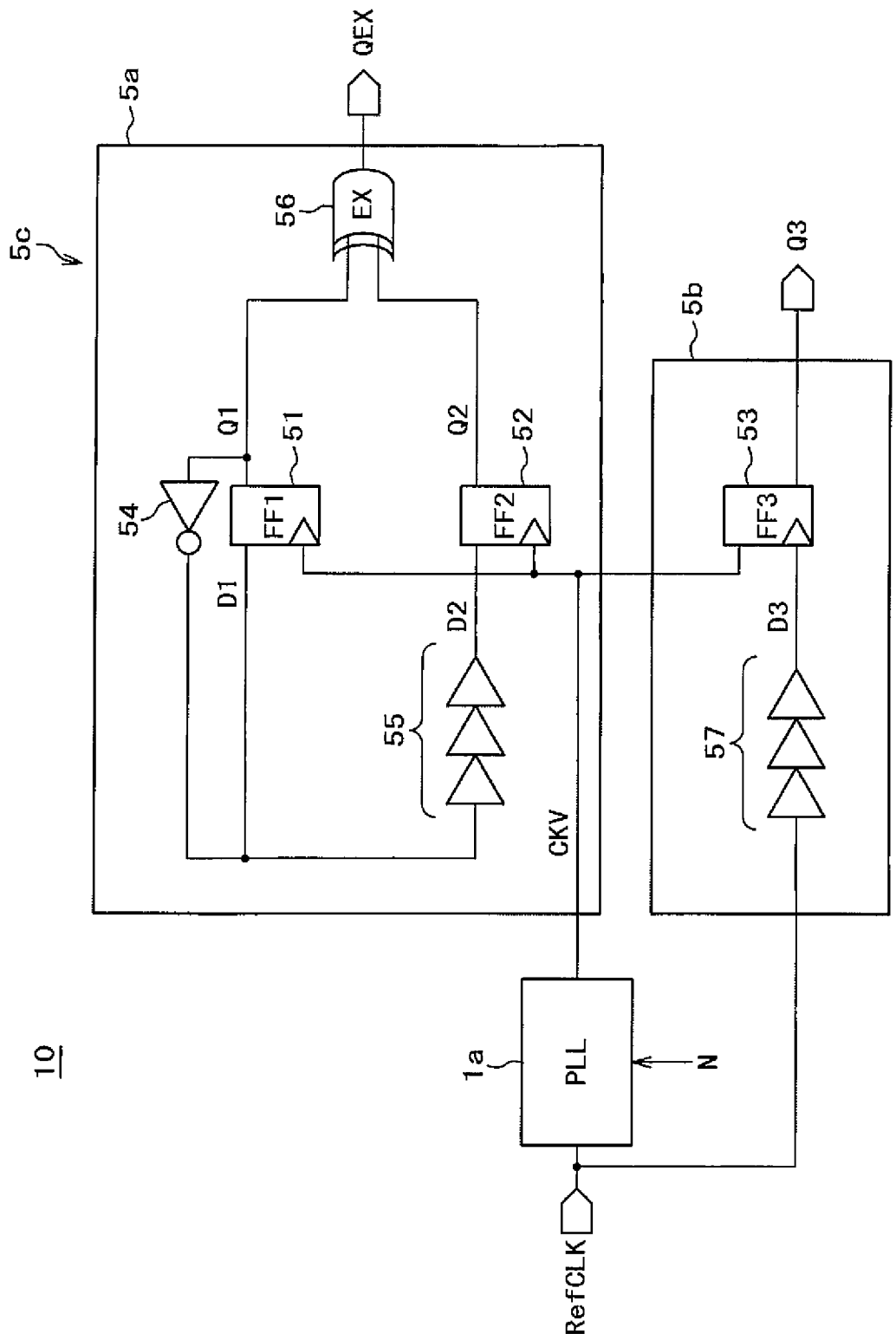
FIG. 14 is a block diagram showing a configuration of a jitter measurement circuit according to the third example.

The configuration of the jitter measurement circuit of the semiconductor device according to the third example will be described with reference to FIG. 14. FIG. 14 is a block diagram showing the configuration of the jitter measurement circuit according to the third example.

In the semiconductor device 10 according to the third example, the jitter measurement circuit 5b in the second example is added to the semiconductor device 10 in the first example. Since the jitter measurement circuit 5a of the first example and the jitter measurement circuit 5b of the second example do not interfere with each other, a jitter measurement circuit 5c is configured by simply combining the jitter measurement circuit 5a and the jitter measurement circuit 5b as shown in FIG. 14. As a result, it is possible to observe both the period jitter of the output clock (CKV) of the PLL circuit 1a and the phase jitter between the output clock (CKV) and the reference clock (RefCLK) as the input clock in parallel.

Fourth Example

Figure 15:
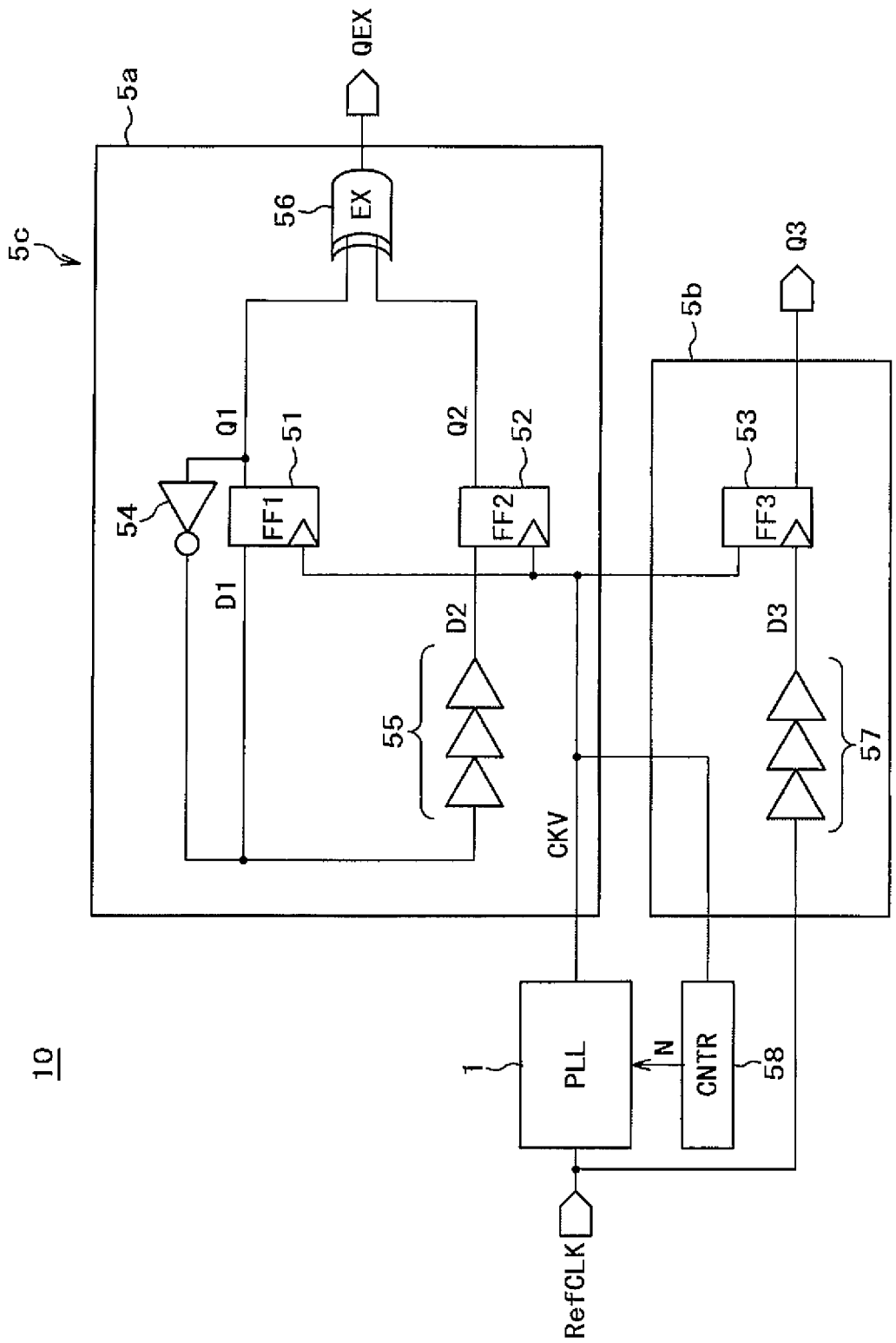
FIG. 15 is a block diagram showing a configuration of a jitter measurement circuit according to the fourth example.

The configuration of the jitter measurement circuit of the semiconductor device according to the fourth example will be described with reference to FIG. 15. FIG. 15 is a block diagram showing the configuration of the jitter measurement circuit according to the fourth example.

In the semiconductor device 10 according to the fourth example, a counter (CNTR) 58 is added to the semiconductor device 10 according to the third example. The counter 58 counts the output clock (CKV) of the PLL circuit 1a and sequentially switches the multiplication set value (N). For example, the counter 58 performs the operation of monotonically increasing or decreasing the multiplication set value (N) every 1000 times of jitter measurement results, that is, every 1000 cycles of the output clock (CKV).

The counter 58 of the fourth example may be similarly added to the jitter measurement circuits of the first example and the second example.

Fifth Example

Figure 16:
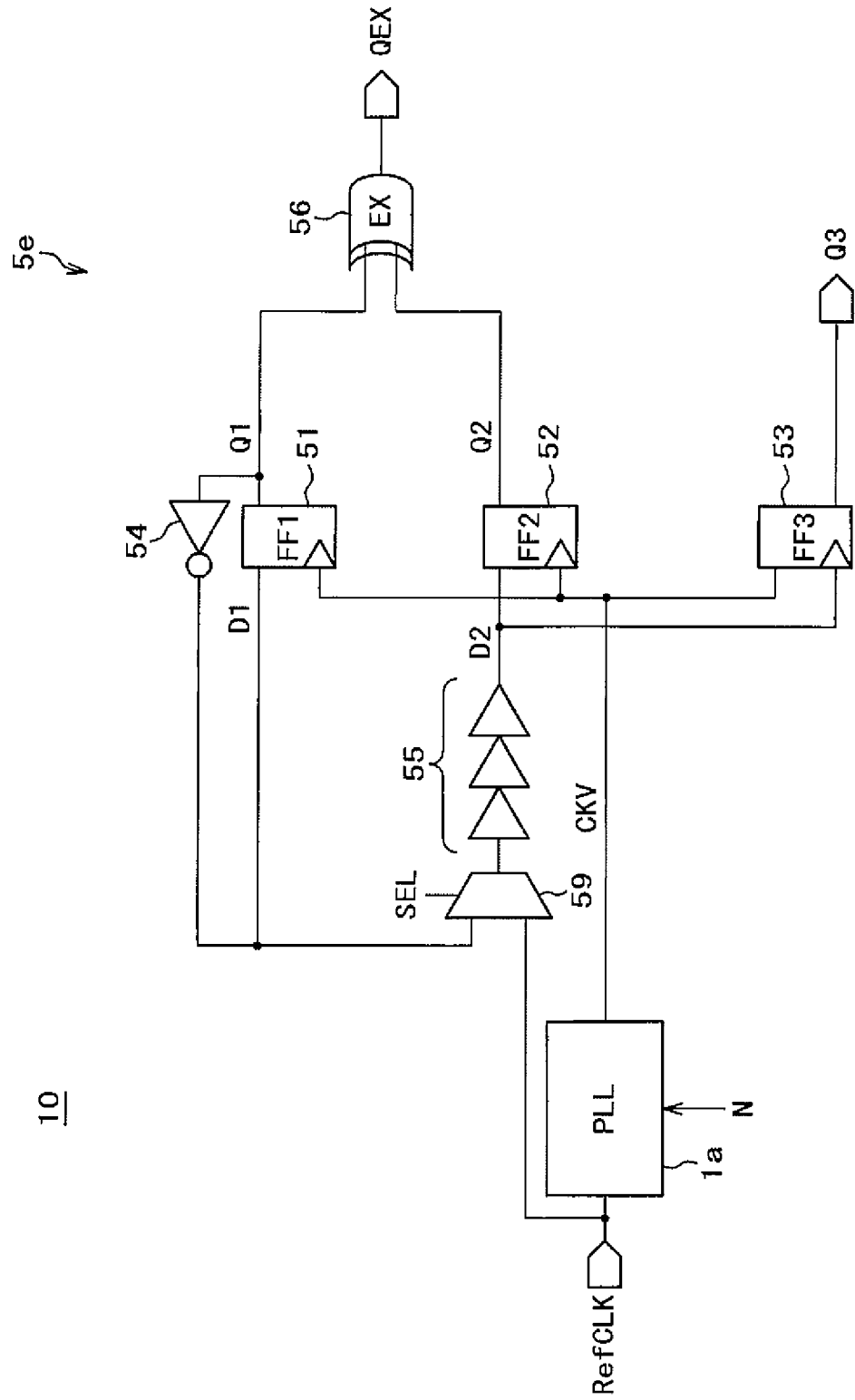
FIG. 16 is a block diagram showing a configuration of a jitter measurement circuit according to the fifth example.

The configuration of the jitter measurement circuit of the semiconductor device according to the fifth example will be described with reference to FIG. 16. FIG. 16 is a block diagram showing the configuration of the jitter measurement circuit according to the fifth example.

In the semiconductor device 10 according to the fifth example, a jitter measurement circuit 5e is formed instead of the jitter measurement circuit 5c of the semiconductor device 10 according to the third example. As shown in FIG. 16, the jitter measurement circuit 5e in the fifth example is configured such that the output of the delay element 55 of the jitter measurement circuit 5c in the third example is input also to the clock terminal of the third flip-flop 53. In addition, the jitter measurement circuit 5e includes a multiplexer 59 which selects the output of the inverter 54 or the reference clock (RefCLK) and inputs it to the delay element 55.

The fixed delay amount when measuring the period jitter as in the first example and the fixed delay amount when measuring the phase jitter as in the second example both use the first cycle of the output clock (CKV) as a guide, and thus it can be shared. Which jitter is to be measured is an exclusive operation. Therefore, the delay element 57 of the jitter measurement circuit 5c in the third example becomes unnecessary.

Sixth Example

Figure 17:
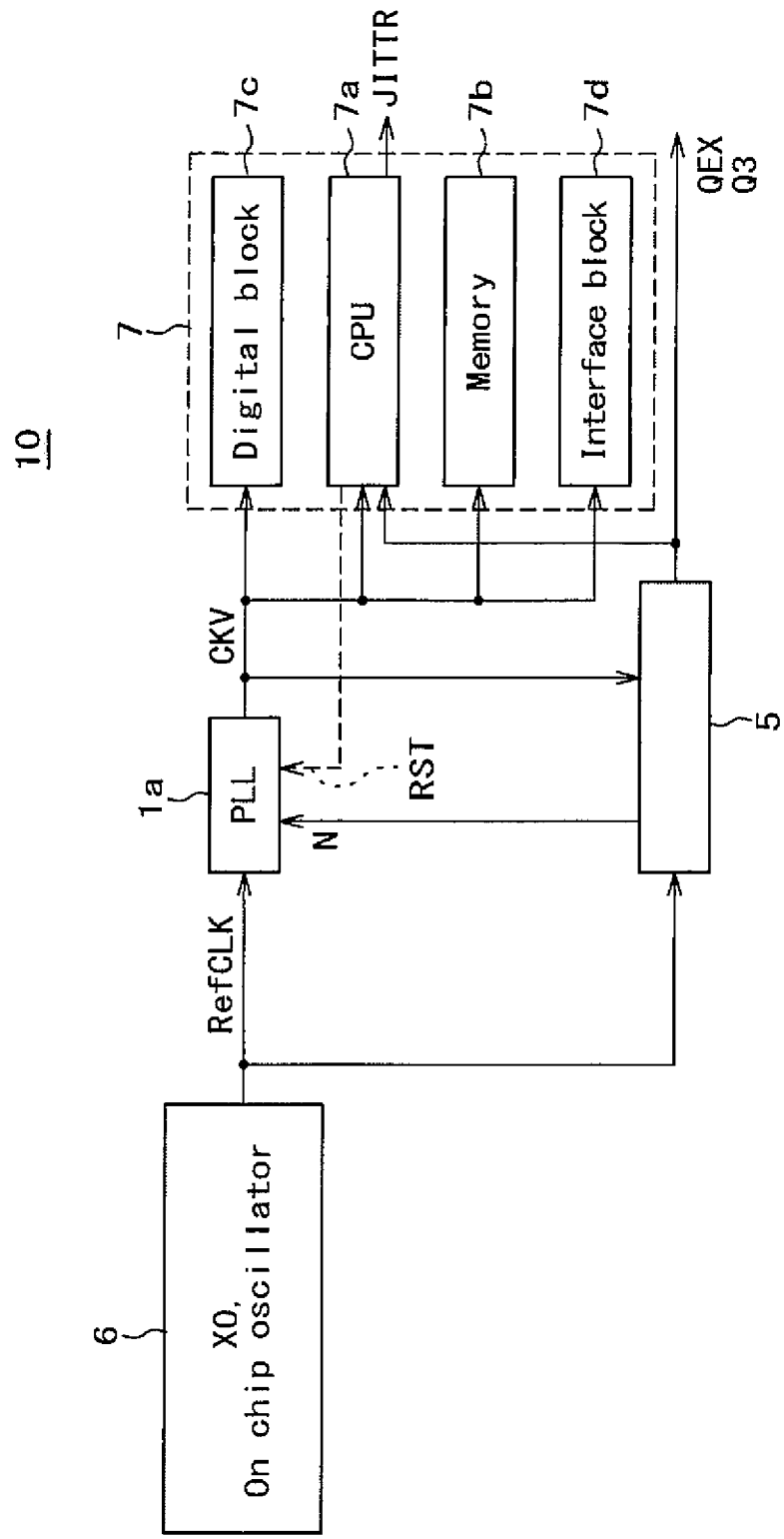
FIG. 17 is a block diagram showing a configuration of a semiconductor device according to the sixth example.

The configuration of the semiconductor device according to the sixth example will be described with reference to FIG. 17. FIG. 17 is a block diagram showing the configuration of the semiconductor device according to the sixth example.

The semiconductor device 10 according to the sixth example includes the PLL circuit 1a, the jitter measurement circuit 5, an on-chip oscillator 6, and a control circuit 7. The on-chip oscillator 6 generates the reference clock (RefCLK) for the PLL circuit 1a. The control circuit 7 includes a CPU (Central Processing Unit) 7a, a memory 7b, a digital block 7c, and an interface block 7d, and is operated based on the output clock (CKV) of the PLL circuit 1a. The CPU 7a executes the program stored in the memory 7b to control the overall semiconductor device 10. The jitter measurement circuit 5 is composed of, for example, the jitter measurement circuit 5d of the fourth example.

The CPU 7a calculates the cumulative frequency distribution and the histogram by the arithmetic operation of the output (QEX, Q3) of the jitter measurement circuit 5, and outputs the jitter calculation result (JTTR). In addition, the CPU 7a generates a reset signal (RST) when an abnormality occurs, and resets the PLL circuit 1 or the overall semiconductor device 10. In the sixth example, the jitter measurement circuit 5 is composed of the jitter measurement circuit 5d of the fourth example, and thus both phase jitter and period jitter are monitored.

According to the sixth example, the clock jitter in the semiconductor device can be observed. In addition, the semiconductor device outputs the jitter calculation result of the PLL circuit in a self-contained manner, and it is possible to reset the PLL circuit or the overall semiconductor device when an abnormality occurs.

The jitter measurement circuit 5 may be the jitter measurement circuit of the first example, the second example, the third example, or the fifth example. In this case, the multiplication set value (N) is set from the CPU 7a.

Seventh Example

Figure 18:
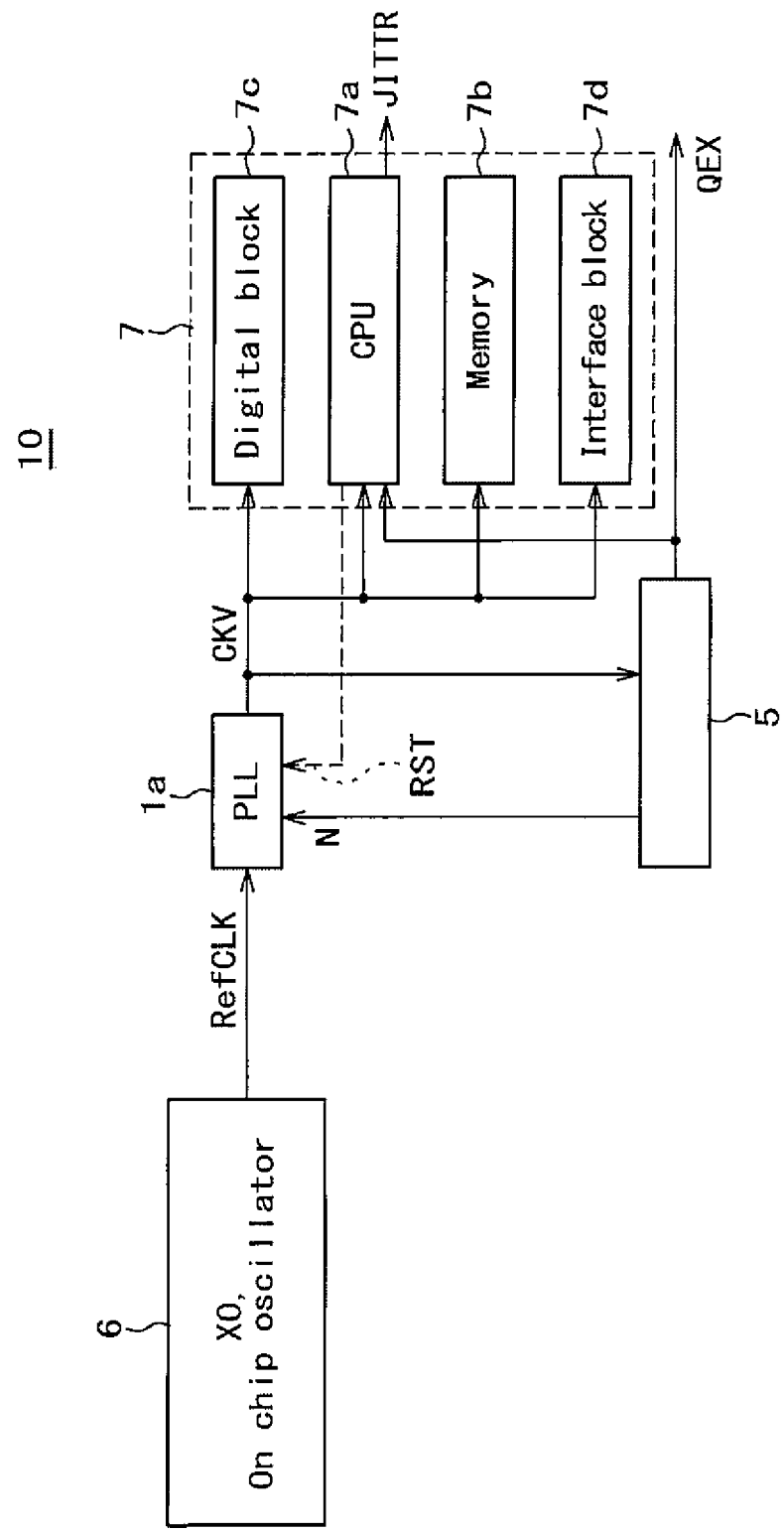
FIG. 18 is a block diagram showing a configuration of a semiconductor device according to the seventh example.

The configuration of the semiconductor device according to the seventh example will be described with reference to FIG. 18. FIG. 18 is a block diagram showing the configuration of the semiconductor device according to the seventh example.

The jitter measurement circuit 5 in the seventh example is composed of, for example, the jitter measurement circuit 5a of the first example. The multiplication set value (N) is set from the CPU 7a. The other configuration of the semiconductor device 10 in the seventh example is the same as that of the semiconductor device in the sixth example. Only the period jitter is observed in the seventh example.

Although the disclosure made by the present discloser has been specifically described above based on embodiment and examples, it goes without saying that the disclosure is not limited to the above-described embodiment and examples and can be variously modified.

What is claimed is:
1. A semiconductor device comprising:
   a clock generating circuit to which a control value for changing a cycle of a clock thereof is input; and
   a jitter measurement circuit configured to receive an output clock of the clock generating circuit as an input, and output presence/absence of a jitter of the output clock,
   wherein the jitter measurement circuit includes a first logic circuit and a first delay element,
   wherein the first logic includes a first flip-flop and a second flip-flop each having a clock terminal to which the output clock is input, an inverter configured to invert an output of the first flip-flop and input the inverted output of the first flip-flop to a data terminal of the first flip-flop, and a circuit configured to compare the output of the first flip-flop and an output of the second flip-flop, and
   wherein the first delay element is configured to delay an output of the inverter and input the delayed output of the inverter to a data terminal of the second flip-flop.

2. The semiconductor device according to claim 1, wherein the clock generating circuit is a PLL, a DLL, or a VCXO.

* * * * *